United States Patent
Gebeyehu et al.

(10) Patent No.: US 11,671,061 B2
(45) Date of Patent: Jun. 6, 2023

(54) LOAD-LINE SWITCHING FOR PUSH-PULL POWER AMPLIFIERS

(71) Applicant: SKYWORKS SOLUTIONS, INC., Irvine, CA (US)

(72) Inventors: Netsanet Gebeyehu, San Jose, CA (US); Tianzuo Xi, Milpitas, CA (US); Sukchan Kang, San Jose, CA (US); Nan Ni, Milpitas, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 358 days.

(21) Appl. No.: 16/582,143

(22) Filed: Sep. 25, 2019

(65) Prior Publication Data

US 2020/0099348 A1    Mar. 26, 2020

Related U.S. Application Data (60) Provisional application No. 62/736,540, filed on Sep. 26, 2018.

(51) Int. Cl.
| | |
|---|---|
| H03F 1/56 | (2006.01) |
| H03F 3/26 | (2006.01) |
| H04B 1/401 | (2015.01) |

(52) U.S. Cl.
CPC ............ *H03F 1/56* (2013.01); *H03F 3/26* (2013.01); *H04B 1/401* (2013.01);
(Continued)

(58) Field of Classification Search
CPC ........ H03F 1/56; H03F 3/26; H03F 2200/451; H03F 2200/387; H03F 2200/537;
(Continued)

(56) References Cited

U.S. PATENT DOCUMENTS

| | | | |
|---|---|---|---|
| 8,207,798 B1 | 6/2012 | Wright | |
| 8,766,723 B1 * | 7/2014 | Loeb | H03F 3/245 |
| | | | 330/276 |

(Continued)

FOREIGN PATENT DOCUMENTS

KR    101101515 B1    1/2012

OTHER PUBLICATIONS

International Search Report and Written Opinion from corresponding International Application No. PCT/US2019/052899 dated Jan. 10, 2020.

*Primary Examiner* — Hafizur Rahman
*Assistant Examiner* — Khiem D Nguyen
(74) *Attorney, Agent, or Firm* — Lando & Anastasi, LLP (57) ABSTRACT

An amplifier system including a push-pull power amplifier having an input to receive a radio frequency (RF) input signal and an output, the push-pull power amplifier being configured to amplify the RF input signal and provide at the output an RF output signal that is an amplified version of the RF input signal, a switchable shunt capacitance switchably connected between a load-line connected to the output of the push-pull power amplifier and a reference potential, and a switch configured to selectively connect the switchable shunt capacitance to the reference potential and disconnect the switchable shunt capacitance from the reference potential to vary an impedance of load-line.

10 Claims, 6 Drawing Sheets

(52) U.S. Cl.
CPC .. *H03F 2200/387* (2013.01); *H03F 2200/451* (2013.01); *H03F 2200/48* (2013.01); *H03F 2200/534* (2013.01); *H03F 2200/537* (2013.01); *H03F 2200/541* (2013.01)

(58) Field of Classification Search
CPC ........... H03F 2200/541; H03F 2200/48; H03F 2200/534; H03F 2200/294; H03F 2200/378; H03F 3/245; H03F 3/195; H03F 1/565; H04B 1/401
USPC ............................. 330/195, 124 R, 295, 251
See application file for complete search history.

(56) References Cited

U.S. PATENT DOCUMENTS

| | | | |
|---|---|---|---|
| 9,160,377 B2 * | 10/2015 | Lee | ............................ H03F 3/72 |
| 2010/0156537 A1 | 6/2010 | Dishop | |
| 2011/0187458 A1 | 8/2011 | Kim et al. | |
| 2013/0162352 A1 | 6/2013 | Khlat | |
| 2014/0070905 A1 * | 3/2014 | Raieszadeh | .............. H03H 7/09 |
| | | | 333/174 |
| 2014/0266408 A1 * | 9/2014 | Guimaraes | .............. H01L 29/94 |
| | | | 327/566 |
| 2016/0149543 A1 | 5/2016 | Anderson et al. | |

* cited by examiner

LOAD-LINE SWITCHING FOR PUSH-PULL POWER AMPLIFIERS

CROSS-REFERENCE TO RELATED APPLICATIONS

This application claims priority under 35 U.S.C. § 119(e) to U.S. Provisional Patent Application Ser. No. 62/736,540 titled LOAD-LINE SWITCHING FOR PUSH-PULL POWER AMPLIFIERS, filed Sep. 26, 2018, which is incorporated by reference herein in its entirety.

BACKGROUND

In mobile applications, such as cellular, it can be very important to prolong battery life to allow mobile devices to operate for relatively long periods of time without being recharged. Power amplification is one of the functions that consumes a significant amount of battery power in mobile applications. Several system and circuit implementations have been directed at reducing current consumption to prolong battery life as well as to improve the thermal reliability of mobile devices. Some common methods used to improve the efficiency of power amplifiers for cellular or other mobile applications include Average Power Tracking (APT), Envelope Tracking (ET), and dynamic load-line tuning. However, these methods can involve complex processing and calibration and therefore are not always desirable in certain applications.

SUMMARY OF INVENTION

Aspects and embodiments described herein are directed to a method and circuit implementations for providing programmable load-line impedance tuning in a push-pull power amplifier.

According to one embodiment, a push-pull power amplifier system having a variable load-line impedance comprises a power amplifier having an input to receive a radio frequency (RF) input signal and an output, the power amplifier configured to amplify the RF input signal and provide at the output an RF output signal that is an amplified version of the RF input signal, an output transformer coupled to the output of the power amplifier and configured to provide the RF output signal on a load-line coupled to the output of the power amplifier, a switchable shunt capacitance switchably connected between the load-line and a reference potential, and a switch configured to selectively connect the switchable shunt capacitance to the reference potential and disconnect the switchable shunt capacitance from the reference potential to vary an impedance of the load-line.

In one example the power amplifier includes a pair of complementary transistors.

In one example the impedance of the load-line is varied to tune a power level of the RF output signal.

In one example the switchable shunt capacitance includes a single fixed-value capacitor. In another example the switchable shunt capacitance includes a variable capacitor. In another example the switchable shunt capacitance includes a plurality of capacitors configured to be selectively connected together in series and/or parallel to provide a selected capacitance value.

In one example the push-pull power amplifier system further comprises an input transformer coupled to the input of the power amplifier. The input transformer may be configured to receive the RF input signal, to split the RF input signal into a pair of balanced RF input signals, and to provide the pair of balanced RF input signals to the power amplifier, and the output transformer may be configured to receive a pair of balanced RF output signals from the power amplifier, and to recombine the pair of balanced RF output signals to provide the RF output signal on the load-line. In another example the push-pull power amplifier system further comprises an input amplifier coupled to an input of the input transformer such that the input transformer is connected between the input amplifier and the power amplifier.

According to another embodiment a power amplifier system comprises a push-pull power amplifier having an input to receive a radio frequency (RF) input signal and an output, the power amplifier configured to amplify the RF input signal and provide at the output an RF output signal that is an amplified version of the RF input signal, a switchable shunt capacitance switchably connected between a load-line coupled to the output of the push-pull power amplifier and a reference potential, a switch configured to selectively connect the switchable shunt capacitance to the reference potential and disconnect the switchable shunt capacitance from the reference potential to vary an impedance of the load-line, and a controller coupled to the switch and configured to control the switch to selectively connect the switchable shunt capacitance to the reference potential and disconnect the switchable shunt capacitance from the reference potential.

In one example, the impedance of the load-line is varied to tune a power level of the RF output signal.

In one example the controller is further coupled to the push-pull power amplifier and configured to control one or more parameters of the push-pull power amplifier. In another example the controller is configured to control the one or more parameters of the push-pull power amplifier and the switch using a mobile industry processor interface (MIPI) control protocol.

In one example the switchable shunt capacitance includes a single fixed-value capacitor. In another example the switchable shunt capacitance includes a variable capacitor. In one example the controller is coupled to the variable capacitor and configured to tune a capacitance value of the variable capacitor. In another example the switchable shunt capacitance includes a plurality of capacitors and a plurality of switches configured to selectively connect together selected ones of the plurality of capacitors in series and/or parallel to provide a selected capacitance value for the switchable shunt capacitance. In one example the controller is coupled to the plurality of switches and configured to control the plurality of switches to connect together the selected ones of the plurality of capacitors to provide the selected capacitance value.

According to another embodiment a method of operating a power amplifier system having at least two modes of operation comprises receiving a radio frequency (RF) input signal at an input of the power amplifier system, amplifying, via a push-pull power amplifier, the RF input signal to provide an amplified RF signal to a load-line, adjusting an impedance of the load-line based on the mode of operation of the power amplifier system, and providing the amplified RF signal to an output of the power amplifier system via the load-line.

In one example adjusting the impedance of the load-line includes connecting a shunt capacitance between the load-line and a reference potential during at least one mode of operation. In another example adjusting the impedance of the load-line includes tuning a capacitance value of a variable shunt capacitor coupled between the load-line and a reference potential. In one example adjusting the impedance of the load-line includes controlling a plurality of switches to connect together selected ones of a plurality of shunt capacitors coupled between the load-line and a reference potential.

In one example the impedance of the load-line is adjusted based on the mode of operation to tune a power level of the amplified RF signal to a target output power level.

Another embodiment is directed to a radio frequency (RF) front-end module comprising a transceiver configured to provide an RF transmit signal and to receive and process an RF received signal, a duplexer, an antenna switch coupled to the duplexer, the antenna switch and the duplexer together being configured to switch operation of the RF front-end module between a transmit mode and a receive mode, and a push-pull power amplifier coupled between the transceiver and the duplexer and configured to receive and amplify the RF transmit signal, the push-pull power amplifier including a shunt capacitance switchably connected between an output load-line of the push-pull power amplifier and a reference potential, and a switch configured to selectively connect the switchable shunt capacitance to the reference potential and disconnect the switchable shunt capacitance from the reference potential to vary an impedance of the output load-line.

In one example the switchable shunt capacitance includes a single fixed-value capacitor. In another example the switchable shunt capacitance includes a variable capacitor. In another example the switchable shunt capacitance includes a plurality of capacitors configured to be selectively connected together in series and/or parallel to provide a selected capacitance value.

In one example the transceiver includes a transmitter circuit configured to provide the RF transmit signal and a receiver circuit configured to receive and process the RF received signal. The RF front-end module may further comprise a low-noise amplifier coupled between the duplexer and the receiver circuit and configured to amplify the RF received signal.

According to another embodiment a wireless device comprises an antenna, a transceiver configured to provide RF transmit signals and to receive and process RF received signals, an antenna switch module coupled between the transceiver and the antenna and configured to switch operation of the wireless device between a transmit mode and a receive mode, and a power amplifier module coupled between the transceiver and the antenna switch module and configured to receive and amplify the RF transmit signals, the power amplifier module including at least one push-pull power amplifier having a variable load-line impedance, the at least one push-pull power amplifier including a shunt capacitance switchably connected between a load-line of the at least one push-pull power amplifier and a reference potential, and a switch configured to selectively connect the switchable shunt capacitance to the reference potential and disconnect the switchable shunt capacitance from the reference potential to vary the load-line impedance.

In one example the switchable shunt capacitance includes a single fixed-value capacitor. In another example the switchable shunt capacitance includes a variable capacitor. In another example the switchable shunt capacitance includes a plurality of capacitors configured to be selectively connected together in series and/or parallel to provide a selected capacitance value.

The wireless device may further comprise a power management system coupled to the power amplifier module and configured to control the switch of the at least one push-pull power amplifier to selectively vary the load-line impedance. In one example the power management system is further coupled to the transceiver and configured to control at least one operating parameter of the transceiver.

The wireless device may further comprise a directional coupler connected between the power amplifier module and the antenna switch module, the directional coupler being configured to extract a portion of each of the RF transmit signals by electromagnetic coupling to provide RF coupled signals. In one example the wireless device further comprises a sensor coupled to the directional coupler and to the transceiver, the sensor being configured to receive the RF coupled signals and to provide feedback information to the transceiver to regulate an output power level of the power amplifier module based on the Rf coupled signals.

The wireless device may further comprise a low-noise amplifier coupled between the antenna switch module and the transceiver and configured to amplify the RF received signals during the receive mode.

According to another embodiment an amplifier system comprises a push-pull power amplifier having an input to receive a radio frequency (RF) input signal and an output, the push-pull power amplifier being configured to amplify the RF input signal and provide at the output an RF output signal that is an amplified version of the RF input signal, a switchable shunt capacitance switchably connected between a load-line connected to the output of the push-pull power amplifier and a reference potential, and a switch configured to selectively connect the switchable shunt capacitance to the reference potential and disconnect the switchable shunt capacitance from the reference potential to vary an impedance of load-line.

In one example the switchable shunt capacitance includes a single fixed-value capacitor. In another example the switchable shunt capacitance includes a variable capacitor. In another example the switchable shunt capacitance includes a plurality of capacitors configured to be selectively connected together in series and/or parallel to provide a selected capacitance value.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to methods and circuitry for improving the efficiency of a power amplifier, and thus prolonging the battery life and improving device reliability, by introducing a programmable load-line that can be switched to present the power amplifier with a selected load-line impedance for a given target transmit power.

Load-line switching can be static or dynamic in implementation. In general, dynamic load-line switching may potentially improve the efficiency of a power amplifier more than static load-line switching when driven with a complex modulated signal. However, implementation of dynamic load-line switching may be too complex for many applications and may require complex calibration routines. Static load-line switching refers to the case where the load-line impedance is adjusted for average power without needing to track the modulation envelope. Accordingly, because the adjustment only needs to be over average power, static load-line switching may be implemented with less complexity than dynamic load-line switching. In addition, according to certain aspects, static load-line switching can be implemented in a way that does not require additional calibration routines on the device level, while still improving the efficiency of the power amplifier.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
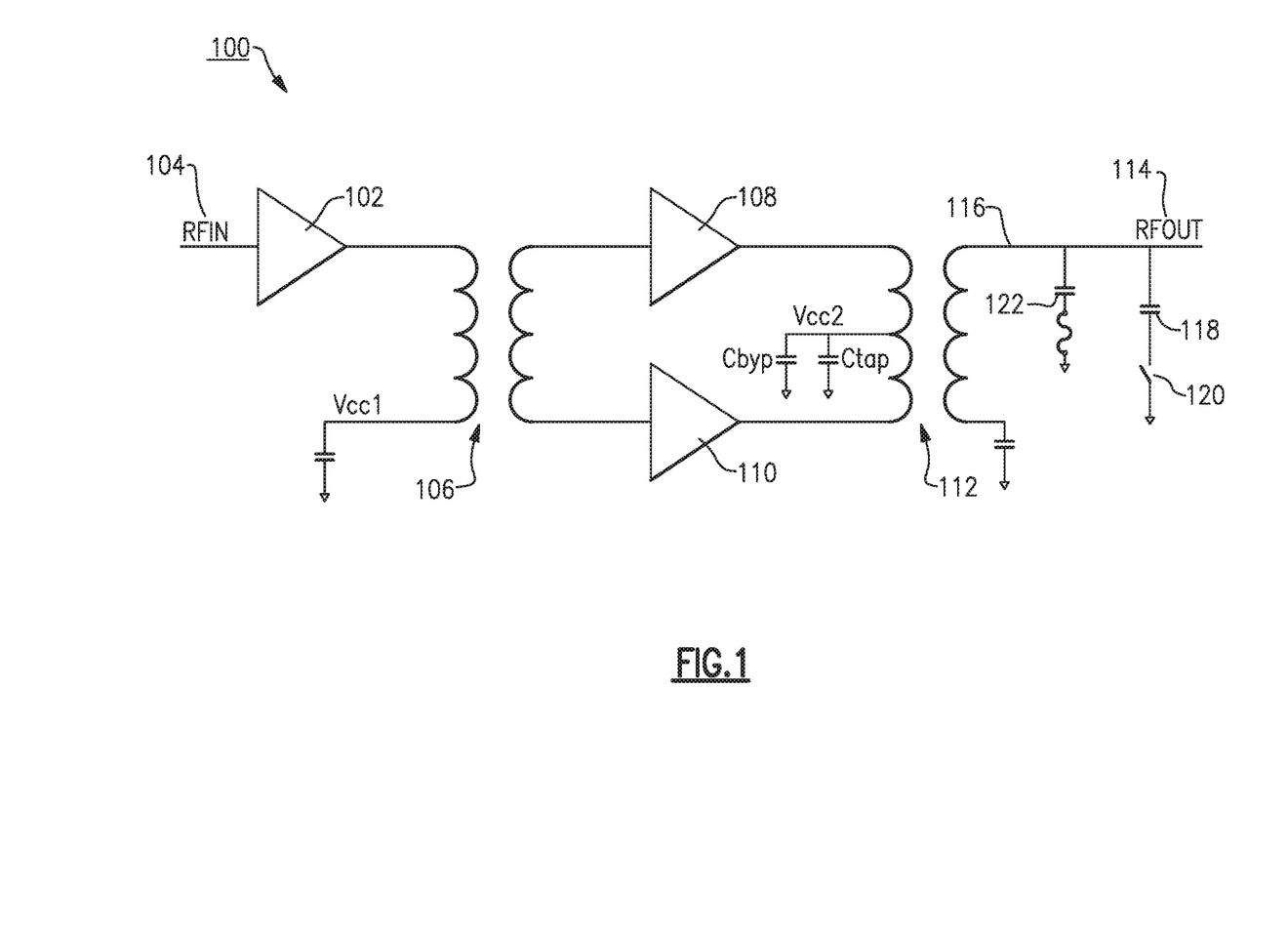
FIG. 1 is a simplified circuit diagram of one example of a push-pull amplifier incorporating load-line switching according to aspects of the present invention.

According to certain embodiments described herein, static load-line switching is implemented as part of a push-pull power amplifier architecture. An example is illustrated in FIG. 1. In this example, the push-pull amplifier 100 includes an input amplifier 102 that amplifies an input radio frequency (RF) signal (RFIN) 104. A first transformer 106 splits the single/unbalanced RF input signal 104 into pair of balanced signals and couples the balanced input signals to a pair of complementary amplifiers 108, 110. A second transformer 112 recombines the amplified balanced signals output from the amplifiers 108, 110 and couples an unbalanced output RF signal (RFOUT) 114 onto a load line 116. The amplifiers 108, 110 may be implemented as complementary transistors, one dissipating or "sinking" current from the load line 116 to ground or a negative power supply, and the other supplying or sourcing current to the load line 116 from a positive power supply. The transistors may be bipolar junction transistors (BJTs), field effect transistors (FETs), or other types of transistors. In some examples, the amplifiers 108, 110 may be included in a power amplifier.

In the example of the push-pull amplifier 100 shown in FIG. 1, a shunt capacitor 118 is connected at the single-ended terminal of the second transformer 112 to adjust the impedance of the load-line 116. The shunt capacitor 118 is switchably connected between the load-line 116 and a reference potential, which may be ground. By connecting the shunt capacitor 118 to the reference potential or disconnecting it from the reference potential, using a switch 120 as shown, the impedance of the load-line 116 can be transformed to an optimal load-line at the output of the power amplifier including the amplifiers 108 and 110. When connected to the reference potential, the shunt capacitor 118 adjusts both the real and imaginary part of the load-line impedance, and provides an important tuning parameter for the power amplifier load-line 116 in addition to tuning provided by the transformer 112 itself. Some embodiments described herein may include one or more additional switchable shunt capacitor(s) 118 to increase or decrease the impedance value of the power amplifier load-line 116 by selectively connecting or disconnecting ("programming") the switchable capacitor(s) 118 from the reference potential. The example shown in FIG. 1 includes a single switchable capacitor 118, controlled by the switch 120; however, other examples and embodiments may include multiple switchable capacitors 118 that may be programmed to adjust the impedance of the load-line 116 across different target powers. In addition, in certain examples, one or more switchable capacitors 118 may be variable capacitors.

Figure 2:
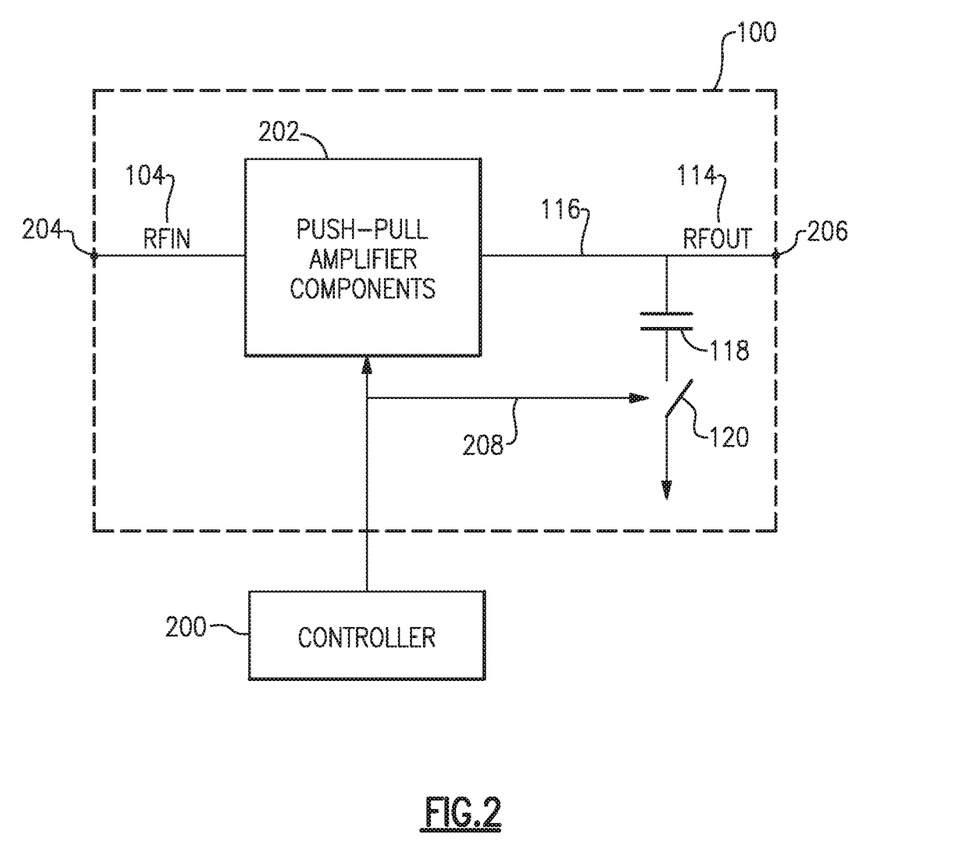
FIG. 2 is a block diagram of one example of an amplifier system according to aspects of the present invention.

The switch 120 that controls the switchable shunt capacitor(s) 118 may be controlled by a controller that is part of or coupled to the push-pull amplifier 100. FIG. 2 illustrates a block diagram of one example of an amplifier system including an example of the push-pull amplifier 100 and a controller 200. In this example, the components of the push-pull amplifier 100, other than the switchable shunt capacitor(s) 118 and associated switch 120, are represented collectively at block 202 connected between an input 204 (at which the signal RFIN 104 is received) and an output 206 (at which the amplified signal RFOUT 114 is supplied). The controller 200 may provide control signals to the components 202 of the push-pull amplifier 100 and may also control the switch 120, as indicated by arrow 208. In certain examples, the controller 200 controls the components 202 of the push-pull amplifier 100 via a digital control protocol or interface known as mobile industry processor interface (MIPI). Accordingly, in certain examples the switch 120 is also controllable through MIPI, allowing impedance adjustment of the load-line 116 to be seamlessly integrated into existing amplifier systems or modules without needing additional calibration, software or application note changes. It should be appreciated that different serial communication interfaces other than MIPI may be used, for example I²C, SPI, etc. In some examples, parallel communication interfaces may be used.

Figure 3A:
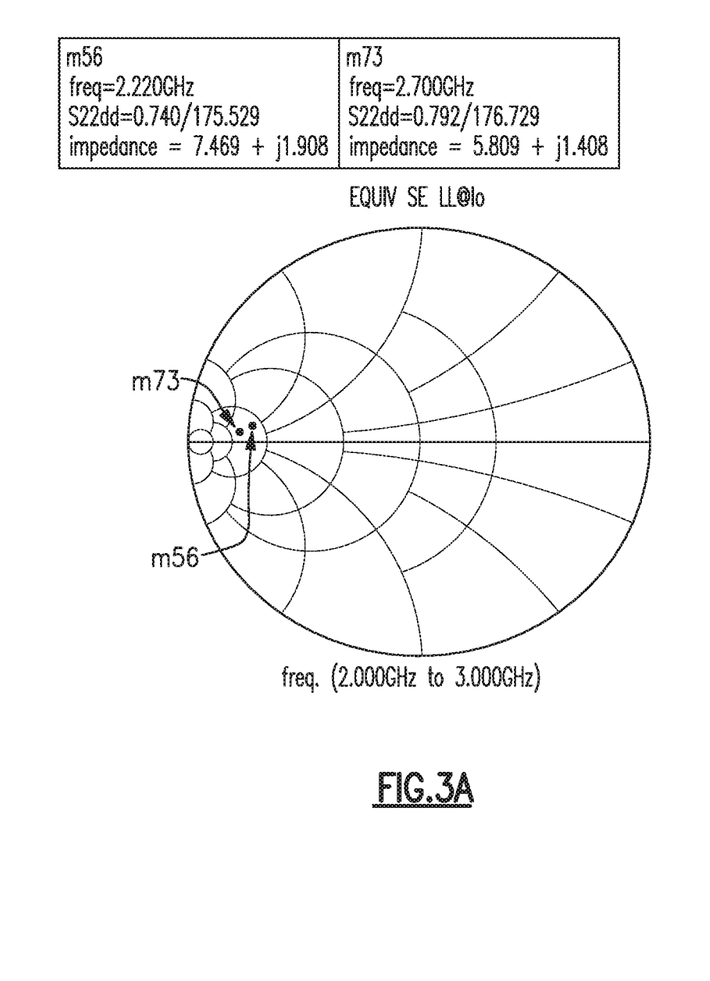
FIG. 3A is a smith chart showing simulated results for an example of the push-pull amplifier shown in FIG. 1, according to aspects of the present invention.
Figure 3B:
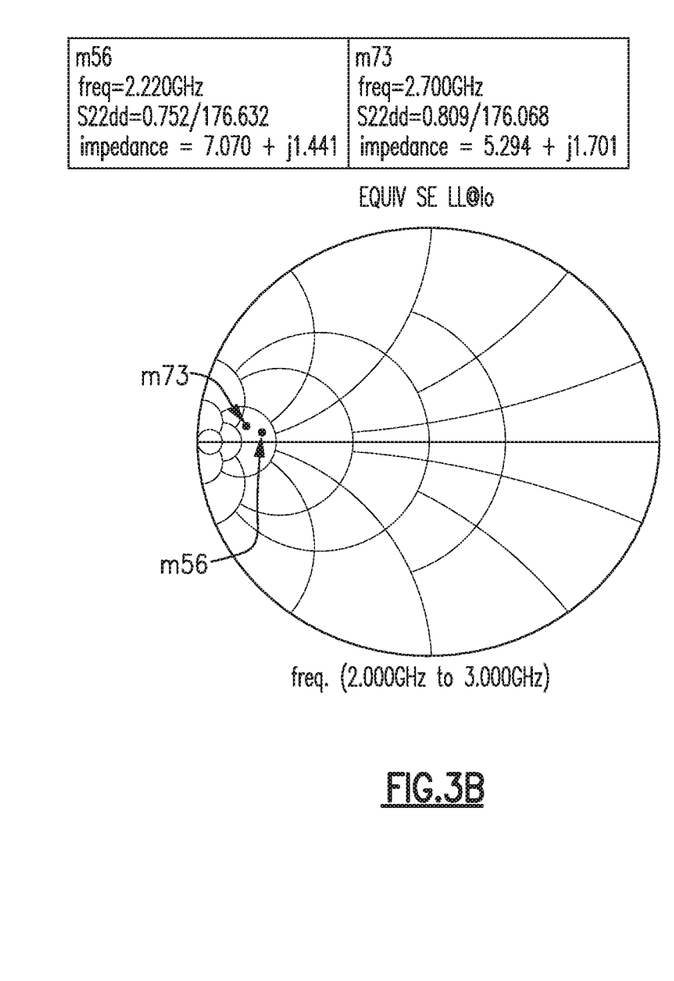
FIG. 3B is a smith chart showing further simulated results for the example of the push-pull amplifier shown in FIG. 1, according to aspects of the present invention.

Examples of the load-line programmability have been demonstrated through simulation. Simulation results shown in FIG. 3A and FIG. 3B demonstrate the programmability of the load-line 116 as the switchable capacitor 118 is connected to the reference potential ("turned ON") and disconnected from the reference potential ("turned OFF") by the switch 120. The simulations were performed over a frequency range of 2.0 GHz to 3.0 GHz, and demonstrate the impedance of the load-line 116 over this range. FIG. 3A shows the simulation results for the case of lower desired power output from the push-pull amplifier 100, and therefore higher load-line impedance, achieved by turning the switchable capacitor 118 ON, while FIG. 3B shows the simulation results for the case of higher desired power output from the push-pull amplifier 100, and therefore lower load-line impedance, achieved by turning the switchable capacitor 118 OFF. As can be seen with reference to FIGS. 3A and 3B, connecting and disconnecting the switchable shunt capacitor 118 from the reference potential alters the load-line impedance while maintaining good matching over the simulation frequency range.

Figure 4A:
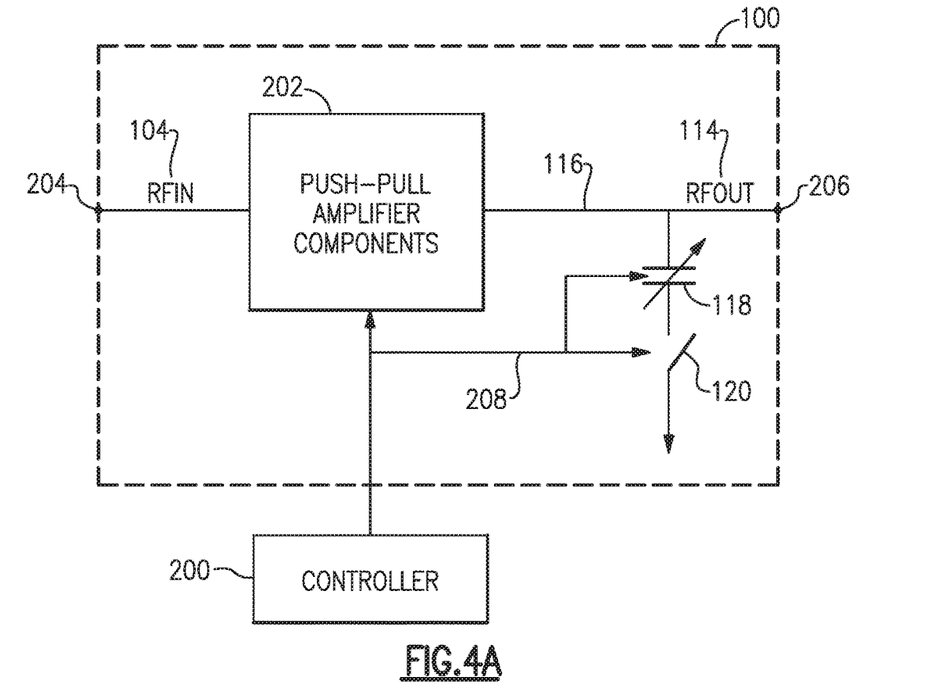
FIG. 4A is a block diagram showing another example of the amplifier system of FIG. 2 in which the switchable capacitor is variable, according to aspects of the present invention.
Figure 4B:
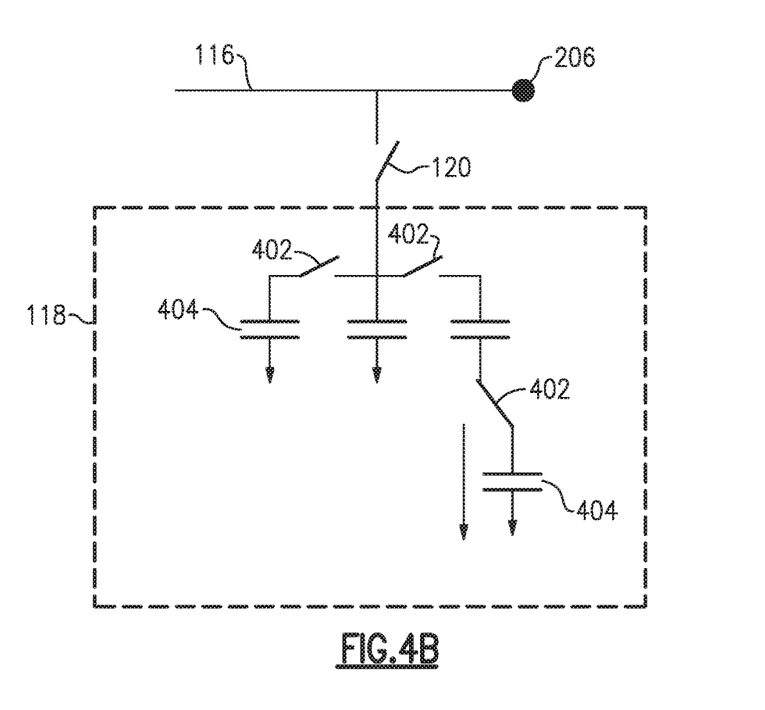
FIG. 4B is a block diagram of one example of a capacitor bank arrangement that may be used to implement the switchable capacitor in FIGS. 1 and 2, according to aspects of the present invention.

Referring again to FIG. 1, according to certain examples, by selecting the value of the switchable capacitor(s) 118 relative to the value of the fixed capacitor 122 normally present at the output of the push-pull amplifier 100, the impedance of the load-line 116 can be adjusted to a desired target value. As discussed above, in certain examples, the switchable capacitor 118 can include a variable capacitor and/or a bank of switchable capacitors. This may allow for tuning of the load-line impedance with a particular tolerance or resolution, and/or extend the tuning range of the impedance value. For example, FIG. 4A illustrates an example in which the switchable capacitor 118 is a variable capacitor, the capacitance value of which may be dynamically adjusted, for example, under control of the controller 200. Using a variable switchable capacitor 118 may allow for more tuning of the load-line impedance than may be achieved using only a single fixed-value switched capacitor. In examples in which a bank of switchable capacitors may be used to implement the switchable capacitor 118, the bank may include any number of capacitors which may be connected together in series, parallel, or combinations thereof. FIG. 4B illustrates one example of the switchable capacitor 118 implemented as a bank of capacitors. Internal switches 402 can be used to connect together any number of capacitors 404 using combinations of series and parallel connections. In some examples, each of the internal switches 402 may be controlled independently to provide different configurations of series and parallel connections. Although not specifically shown in FIG. 4B, any of the capacitors 404 may be variable capacitors. The switches 402 may be controlled by the controller 200 in certain examples.

Embodiments of the push-pull power amplifier 100 may be advantageously used in a variety of electronic devices. For example, embodiments of the push-pull power amplifier 100 may be used as a power amplifier, or as part of a power amplifier module, included in a variety of communications modules and devices, including RF front-end modules and wireless devices, for example.

Figure 5:
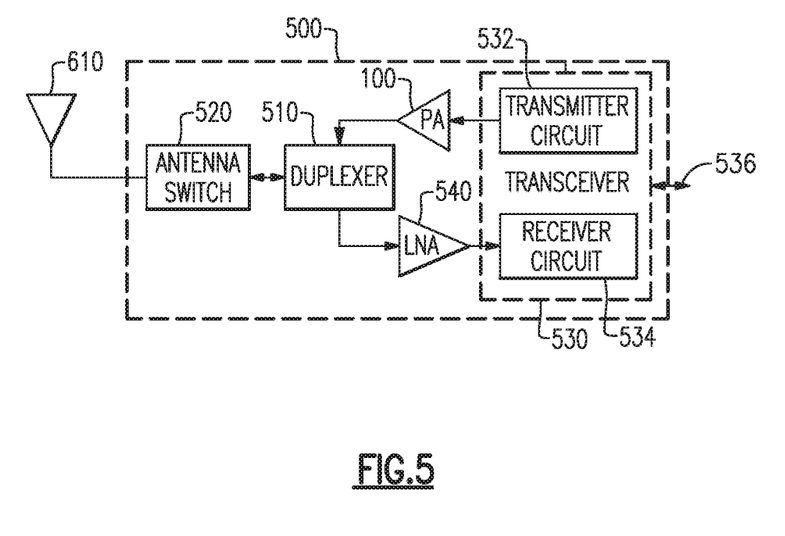
FIG. 5 is a block diagram of one example of an RF front-end module incorporating a push-pull power amplifier according to aspects of the present invention.

FIG. 5 is a block diagram illustrating an example of a typical arrangement of an RF "front-end" sub-system or module (FEM) 500 that may be used in a communications device, such as a mobile phone, for example, to transmit and receive RF signals. The FEM 500 is connected to an antenna 610 and includes a duplexer 510 and an antenna switch 520 such that the FEM 500 can be configured to switch operation between different frequency bands and different operating modes, such as transmit and receive modes, for example. In the example illustrated in FIG. 5, the antenna switch 520 is positioned between the duplexer 510 and the antenna 610; however, in other examples the duplexer 510 can be positioned between the antenna switch 520 and the antenna 610, or the antenna switch 520 and the duplexer 510 can be integrated into a single module. The FEM 500 includes a transceiver 530 that is configured to generate RF signals for transmission and process received RF signals. The transceiver 530 can include a transmitter circuit 532 and a receiver circuit 534. In some embodiments, transmission and reception functionalities can be implemented in separate components (e.g. a transmit module and a receiving module), or be implemented in the same module as shown in FIG. 5. Signals generated for transmission by the transmitter circuit 532 are received by the push-pull power amplifier 100, which amplifies the generated signals from the transceiver 530. As will be appreciated by those skilled in the art, the push-pull power amplifier 100 represents one or more push-pull power amplifiers 100 that can be included in the FEM 500. As discussed above, the push-pull power amplifier 100 can include one or more switchable, optionally variable, capacitors to adjust the impedance of the output load-line (connected to the duplexer 510 in the example shown in FIG. 5) to optimally accommodate different desired power levels or amplification to be provided by the push-pull power amplifier 100. The front-end module 500 further includes a low noise amplifier module 540, which amplifies received signals from the antenna 610 and provides the amplified signals to the receiver circuit 534 of the transceiver 520. The transceiver 530 can communicate with other circuitry in a wireless device or other component in which the FEM 500 is used, as indicated by arrow 536. The ability to tune the load-line impedance of the push-pull power amplifier 100 using the switchable shunt capacitor(s) 118 as discussed above may allow the FEM 500 to operate efficiently in a variety of different situations and applications, for example, where the power level of the input RF signal from the transmitter circuit 532 may vary and/or where the desired power level of the output transmit signal to be transmitted by the antenna 610 may vary, either dynamically (e.g., in response to environmental conditions) or to comply with different communications protocols.

Figure 6:
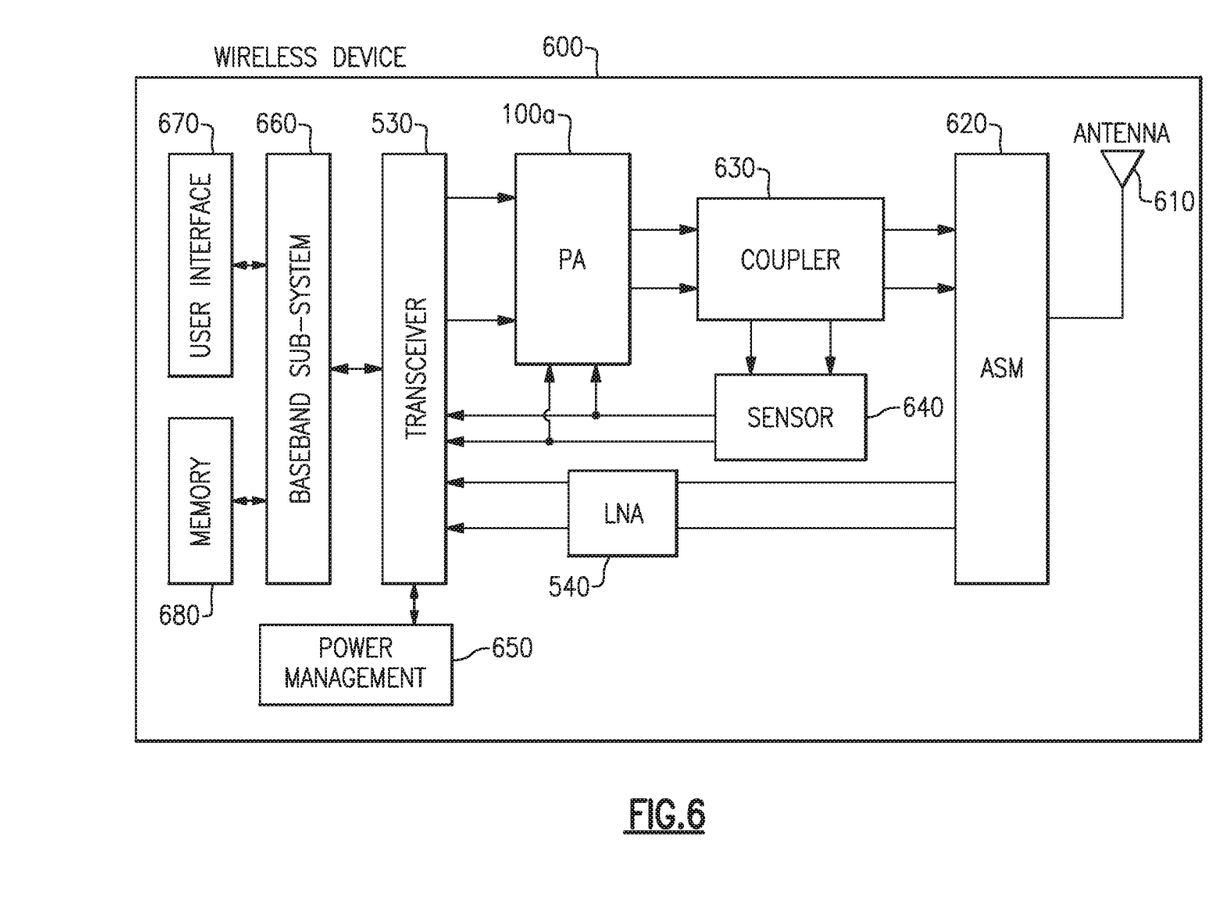
FIG. 6 is a block diagram of one example of a wireless device incorporating one or more push-pull power amplifiers according to aspects of the present invention.

FIG. 6 is a block diagram of one example of a wireless device 600 which may include embodiments of the FEM 500 or similar components. The wireless device 600 can be a cellular phone, smart phone, tablet, modem, communication network or any other portable or non-portable device configured for voice and/or data communication. The wireless device 600 can receive and transmit signals from the antenna 610. The wireless device 600 includes an antenna switch module 620 that can be used to switch between a transmitting mode and a receiving mode of the wireless device 600, for example, or between different transmit or receive frequency bands. In certain examples the antenna switch module 620 includes the antenna switch 520 and duplexer 510 of the FEM 500 discussed above. The wireless device 600 further includes the transceiver 530 that is configured to generate signals for transmission and/or to process received signals. As shown in FIG. 6, in certain embodiments the antenna 610 both receives signals that are provided to the transceiver 530 via the antenna switch module 620 and also transmits signals from the wireless device 600. However, in other examples multiple antennas can be used.

Signals generated for transmission are received by the power amplifier (PA) module 100a, which amplifies the generated signals from the transceiver 530. The power amplifier module 100a can include one or more push-pull power amplifiers 100 discussed above. The power amplifier module 100a can be used to amplify a wide variety of RF or other frequency-band transmission signals. For example, the power amplifier module 100a can receive an enable signal that can be used to pulse the output of the power amplifier to aid in transmitting a wireless local area network (WLAN) signal or any other suitable pulsed signal. The power amplifier module 100a can be configured to amplify signals of a variety of signal types, including, for example, a Global System for Mobile (GSM) signal, a code division multiple access (CDMA) signal, a W-CDMA signal, a Long Term Evolution (LTE) signal, or an EDGE signal. As discussed above, the ability to tune the load-line impedance of any one or more push-pull power amplifiers 100 included in the power amplifier module 100a may allow the power amplifier module 100a to operate efficiently with any of these or other different signal types and communications protocols. In some examples, the receive path may include the low noise amplifier (LNA) 540 configured to amplify the received signals.

A directional coupler 630 can be used to extract a portion of the power from the RF signal traveling between the power amplifier module 100a and the antenna 610 and provide the coupled signal(s) to a sensor module 640. The sensor module 640 may send information to the transceiver 530 and/or directly to the power amplifier module 100a as feedback for making adjustments to regulate the output power level of the power amplifier module 100a. In certain embodiments in which the wireless device 600 is a mobile phone having a time division multiple access (TDMA) architecture, the directional coupler 530 can advantageously manage the amplification of an RF transmitted power signal from the power amplifier module 100a. In a mobile phone having a time division multiple access (TDMA) architecture, such as those found in Global System for Mobile Communications (GSM), code division multiple access (CDMA), and wideband code division multiple access (W-CDMA) systems, the power amplifier module 100a can be used to shift power envelopes up and down within prescribed limits of power versus time. For instance, a particular mobile phone can be assigned a transmission time slot for a particular frequency channel. In this case the power amplifier module 100a can be employed to aid in regulating the power level of one or more RF power signals over time, so as to prevent signal interference from transmission during an assigned receive time slot and to reduce power consumption. In such systems, the directional coupler 630 can be used to measure the power of a power amplifier output signal to aid in controlling the power amplifier module 100a. As discussed above, as the power levels of the power amplifier module 100a are adjusted, the switchable capacitor(s) 118 associated with the push-pull amplifier(s) 100 making up the power amplifier module 100a can be turned ON and OFF to adjust the load-line impedance, thereby improving the efficiency of the power amplifier module 100a and aiding in conserving battery life in the wireless device 600.

Still referring to FIG. 6, the wireless device 600 further includes a power management system 650 that is connected to the transceiver 530 and that manages power during operation of the wireless device 600. The power management system 650 can also control the operation of a baseband sub-system 660 and other components of the wireless device 600. The power management system 650 can include, or can be connected to, a battery (not shown) that supplies power for the various components of the wireless device 600. The power management system 650 can further include one or more processors or controllers, such as the controller 200 discussed above, that may provide control signals to configure operation of the various components of the wireless device 600, including the power amplifier module 100a and the directional coupler 630, for example. In one embodiment, the baseband sub-system 660 is connected to a user interface 670 to facilitate various input and output of voice and/or data provided to and received from the user. The baseband sub-system 660 can also be connected to memory 680 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A push-pull power amplifier system having an input, an output, and a variable load-line impedance comprising:
   an input amplifier coupled to the input of the push-pull power amplifier system to receive an unbalanced radio frequency (RF) input signal and provide an unbalanced amplified RF signal at an output of the input amplifier;
   an input transformer having a primary winding coupled to the output of the input amplifier and having a secondary winding to provide a pair of balanced RF signals based on the unbalanced amplified RF signal;
   a pair of complementary amplifiers to receive a respective balanced RF signal of the pair of balanced RF signals and provide a pair of amplified balanced RF signals;
   an output transformer having a primary winding to receive a respective amplified balanced RF signal of the pair of amplified balanced RF signals and a secondary winding to provide an unbalanced amplified RF output signal on a load-line coupled to the output of the push-pull power amplifier system;
   a switchable shunt capacitance switchably connected between the load-line and a reference potential; and
   a switch configured to selectively connect the switchable shunt capacitance to the reference potential and disconnect the switchable shunt capacitance from the reference potential to vary an impedance of the load-line to match an impedance at the primary winding of the output transformer.

2. The push-pull power amplifier system of claim 1 wherein the impedance of the load-line is varied to tune a power level of the unbalanced amplified RF output signal.

3. The push-pull power amplifier system of claim 1 wherein the switchable shunt capacitance includes a single fixed-value capacitor.

4. The push-pull power amplifier system of claim 1 wherein the switchable shunt capacitance includes a variable capacitor.

5. The push-pull power amplifier system of claim 1 wherein the switchable shunt capacitance includes a plurality of capacitors configured to be selectively connected together in series and/or parallel to provide a selected capacitance value.

6. The push-pull power amplifier system of claim 1 further comprising a fixed-value capacitor non-switchably coupled between the load-line and the reference potential, wherein the switchable shunt capacitance includes a plurality of capacitors switchably connected together in parallel with the fixed-value capacitor to provide a selected capacitance value.

7. The push-pull power amplifier system of claim 1 further comprising at least one capacitor coupled to a center tap of the primary winding of the output transformer.

8. The push-pull power amplifier system of claim 7 wherein the at least one capacitor is coupled between the center tap of the primary winding of the output transformer and the reference potential.

9. The push-pull power amplifier system of claim 8 wherein the secondary winding of the output transformer has a first end to provide the unbalanced amplified RF output signal and a second end that is coupled to the reference potential through a capacitor.

10. The push-pull power amplifier system of claim 1 wherein the secondary winding of the output transformer has a first end to provide the unbalanced amplified RF output signal and a second end that is coupled to the reference potential through a capacitor.

\* \* \* \* \*